US010375824B2

(12) United States Patent
Sperber et al.

(10) Patent No.: US 10,375,824 B2
(45) Date of Patent: Aug. 6, 2019

(54) MULTI-FUNCTIONAL HIGH-CURRENT CIRCUIT BOARD

(71) Applicant: ZF Friedrichshafen AG, Friedrichshafen (DE)

(72) Inventors: Michael Sperber, Sulzbach-Rosenberg (DE); Wilfried Lassmann, Hirschau (DE); Dirk Schramm, Fürth (DE)

(73) Assignee: ZF FRIEDRICHSHAFEN AG, Friedrichshafen (DE)

(*) Notice: Subject to any disclaimer, the term of this patent is extended or adjusted under 35 U.S.C. 154(b) by 2 days.

(21) Appl. No.: 15/758,460

(22) PCT Filed: Aug. 11, 2016

(86) PCT No.: PCT/EP2016/069157
§ 371 (c)(1),
(2) Date: Mar. 8, 2018

(87) PCT Pub. No.: WO2017/041984
PCT Pub. Date: Mar. 16, 2017

(65) Prior Publication Data

US 2018/0263111 A1 Sep. 13, 2018

(30) Foreign Application Priority Data

Sep. 11, 2015 (DE) ........................ 10 2015 217 426

(51) Int. Cl.

| | |
|---|---|
| ***H05K 1/02*** | (2006.01) |
| ***H05K 1/11*** | (2006.01) |
| ***H05K 1/18*** | (2006.01) |

(52) U.S. Cl.
CPC .......... *H05K 1/0265* (2013.01); *H05K 1/021* (2013.01); *H05K 1/0206* (2013.01);
(Continued)

(58) Field of Classification Search
CPC ....... G06F 1/181–182; H05K 7/20218–20381; H05K 7/20409–20418;
(Continued)

(56) References Cited

U.S. PATENT DOCUMENTS

| | | | | |
|---|---|---|---|---|
| 6,940,266 B2 * | 9/2005 | Roden | .................... | G01R 1/203 324/126 |
| 7,019,337 B2 * | 3/2006 | Eden | .................. | H01L 23/4824 257/107 |

(Continued)

FOREIGN PATENT DOCUMENTS

| | | |
|---|---|---|
| EP | 1 715 732 A2 | 10/2006 |
| WO | WO 2014/130030 A1 | 8/2014 |
| WO | WO 2015/004952 A1 | 1/2015 |

OTHER PUBLICATIONS

International Search Report (English translation) for International PCT Application No. PCT/EP2016/069157, dated Nov. 8, 2016, 3 pages.

(Continued)

*Primary Examiner* — Anthony M Haughton
*Assistant Examiner* — Razmeen Gafur
(74) *Attorney, Agent, or Firm* — Brinks Gilson & Lione

(57) ABSTRACT

A multifunctional high current circuit board includes a high current-carrying current-conducting layer and a switching layer, which is connected to at least one heat source, wherein high current-carrying potentials are conducted into the switching layer.

15 Claims, 3 Drawing Sheets

8
5
6
7
6
9
10
1
2
4
11
12
7
12
3
15
13
14

(52) U.S. Cl.
CPC ........... *H05K 1/0209* (2013.01); *H05K 1/115* (2013.01); *H05K 1/185* (2013.01); *H05K 2201/064* (2013.01); *H05K 2201/066* (2013.01); *H05K 2201/09327* (2013.01); *H05K 2201/10015* (2013.01); *H05K 2201/10053* (2013.01)

(58) Field of Classification Search
CPC ..... H05K 7/20009–202; H05K 1/0265; H05K 1/0206; H05K 1/0209; H05K 1/021; H05K 1/115; H05K 1/185; H05K 2201/064; H05K 2201/066; H05K 2201/09327; H05K 2201/10015; H05K 2201/10053; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS 7,863,098 B2* 1/2011 Lange ................. H01L 23/3107 257/E21.511
8,441,806 B2* 5/2013 Tsukada ................ H01L 23/142 174/258
9,111,928 B2* 8/2015 Li ......................... H02M 3/155
9,185,803 B2* 11/2015 Brey ................... H01L 23/5389
9,983,370 B1* 5/2018 Mahoney ........... H05K 7/20418
10,056,176 B2* 8/2018 Wang ..................... H01C 7/021
2005/0230746 A1* 10/2005 Eden ................... H01L 23/4824 257/330
2008/0239685 A1* 10/2008 Kawabe ................. H01G 4/232 361/782
2010/0038119 A1* 2/2010 Kosowsky ............. C25D 5/022 174/256
2010/0200285 A1* 8/2010 Kariya ................ H01L 21/4867 174/260
2010/0295138 A1* 11/2010 Montanya Silvestre .................... B81C 1/00246 257/415
2011/0267776 A1* 11/2011 Porreca ................ H05K 7/1404 361/694
2012/0181067 A1 7/2012 Wen et al.
2012/0273963 A1* 11/2012 Mirsky ............... H01L 23/3735 257/774
2012/0287581 A1* 11/2012 Sauerbier ............. H05K 1/0206 361/720
2014/0085829 A1* 3/2014 Yamashita ........ H01L 23/49827 361/717
2014/0182898 A1 7/2014 Lassmann et al.
2014/0369006 A1* 12/2014 Williams ............. H05K 1/0203 361/712
2015/0118391 A1* 4/2015 Kilhenny ............. H05K 3/4661 427/97.2
2016/0014878 A1* 1/2016 Kilhenny .............. H01L 23/142 257/99
2016/0037671 A1* 2/2016 Hsiao ................... H05K 7/1432 361/716
2016/0192495 A1* 6/2016 Nakamura .......... H01L 23/5227 361/783
2016/0273720 A1* 9/2016 Livesay ................ H01L 33/641
2017/0309746 A1* 10/2017 Cai ...................... H01L 29/7826
2018/0117832 A1* 5/2018 Haider ................... B33Y 30/00
2018/0130732 A1* 5/2018 Tuominen ........... H01L 21/4853
2018/0247892 A1* 8/2018 Ikegaya .................. H01L 21/28

OTHER PUBLICATIONS

International Search Report and Written Opinion (in German) for International PCT Application No. PCT/EP2016/069157, dated Nov. 8, 2016, 9 pages.
pp. 4-6 of the International Preliminary Report on Patentability and Annexes Thereto (Including Article 34 PCT Amendments) (English translation) for International Patent Application No. PCT/EP2016/069157 dated Nov. 27, 2017, 11 pages.
International Preliminary Report on Patentability and Annexes Thereto (Including Article 34 PCT Amendments) (in German) for International Patent Application No. PCT/EP2016/069157 dated Nov. 27, 2017, 17 pages.

* cited by examiner 6
7
6
10
11
12
7
12
14
13
8
15
5
9
1
4
3
2

12
17
16
25
15
24
25
22
20
25
23
21

MULTI-FUNCTIONAL HIGH-CURRENT CIRCUIT BOARD

RELATED APPLICATIONS

This application is a filing under 35 U.S.C. § 371 of International Patent Application PCT/EP2016/069157, filed Aug. 11, 2016, and claims the benefit and priority of German Patent Application DE 10 2015 217 426.3, filed Sep. 11, 2015, both of which are incorporated by reference herein in their entirety.

BACKGROUND

The invention relates to a multifunctional high current circuit board. A multifunctional high current circuit board is known from the not pre-published DE 10 2014 207 596.3. Printed circuit boards are also known, for example, from US 2014/0182898 A1, US 2012/0181067 A1, WO 2014/130030 A1, WO 2015/004952 A1 and EP 1 714 732 A2.

BRIEF SUMMARY

It is the objective of the invention to improve a multi-functional high current circuit board and in particular to enable an improved heat dissipation.

To solve this task, a multifunctional high current circuit board is presented in accordance with the characteristics of patent claim 1. The multifunctional high current circuit board includes a high current-carrying current-conducting layer and a switching layer, which is connected to at least one heat source. It is essential that the high current-carrying potential is conducted into the switching layer. For this, two switching sub-layers of the switching layer are connected directly to a high current-carrying structure of the current conducting layer by means of numerous through-holes. This ensures a thermally low impedance connection to the at least one heat source. It is possible that there is a heat flux from the at least one heat source into the multifunctional high current circuit board. An optimized, in particular a branched and effective, heat flux from the at least one heat source is ensured. In contrast to a high current circuit board, which is known from the prior art, in which high current-carrying potentials are not conducted within the switching layer and where interlayer connectors and/or micro through-hole platings are thus necessary for a connection to the current-carrying layer, the high current circuit board ensures an optimized heat flux. In the high current circuit board according to the prior art, the high current-carrying signals have to pass interlayer connectors and/or the micro through-hole platings, whereby additional thermal resistance is produced and additional, undesired heat sources during operation, in particular by the power switches are caused. The high current circuit board according to the invention enables an optimized concept for heat dissipation. The multifunctional high current circuit board can be operated in a non-destructive manner. The durability of the high current circuit board is increased. The high current circuit board can particularly be used in construction spaces with limited active cooling options. High-temperature applications, such as within a gear box, are possible. The multifunctional high current circuit board is thermally robust.

Two of the neighboring, in particular adjacently arranged switching sub-layers of the switching layer of the at least one heat source is supplied with the high current-carrying potentials. The thermal impedance of the switching sub-layers can thus be additionally reduced. The switching sub-layers are preferably designed as copper layers.

The two most adjacent switching sub-layers are interconnected, wherein the connection is arranged by means of at least one micro through-hole plating. By means of the two connected switching sub-layers, it is possible to provide an increased copper cross-section for the heat dissipation.

Advantageous embodiments of the high current circuit board can be derived from the characteristics of the dependent claims of claim 1.

One embodiment of the high current circuit board is advantageous, in which the at least one heat source features an electrolytic capacitor and/or a power switch. Electrolytic capacitors and power switches are essential components of a multifunctional high current circuit board. Such components are frequently used in high current circuit boards. Since these components are taken into account as heat sources for the multifunctional high current circuit board, the high current circuit board provides a broad application range.

The embodiment of the high current circuit board with a passive cooling element is advantageous. The passive cooling element is particularly arranged as a heat dissipation layer. A passive cooling element in terms of the present invention relates to a cooling without any external energy input, in particular by means of heat dissipation via a heat conducting medium to the cooling unit.

Particularly advantageous is an embodiment of the high current circuit board in which at least some sections of the passive cooling element are attached to the high current circuit board via a heat-conducting medium. The passive cooling element thus forms a transfer surface towards the high current circuit board in some sections. This facilitates the heat-conducting from the high current circuit board via the heat-conducting medium to the cooling element. The passive cooling element is used efficiently.

Particularly advantageous is an embodiment of the high current circuit board in which the passive cooling element is directly connected to the at least one heat source and/or to the two switching sub-layers, in particular in an indirect manner, via a thermal connecting element. A heat flux from the at least one heat source and/or from the two switching sub-layers into the passive cooling element is improved. The heat dissipation via the passive cooling element by means of heat-conducting is ensured.

Particularly advantageous is an embodiment of the high current circuit board in which the thermal connecting element is a sealing compound and/or a heat-conducting medium. The heat flux from the at least one heat source into the passive cooling element is thereby improved.

An embodiment of the high current circuit board with an active cooling element is advantageous. An active cooling element in line with the invention particularly refers to a powered cooling element, which uses external energy to operate the cooling. The active cooling element is particularly arranged adjacent to the at least one heat source. The heat dissipation is thus improved.

Particularly advantageous is an embodiment of the high current circuit board in which the active cooling element is designed as cooling water pump. An advantageous integration of the active cooling element into the high current circuit board is thus simplified.

Particularly advantageous is an embodiment of the high current circuit board in which the active cooling element is connected to the at least one heat source via a thermal connecting element and/or via a passive cooling element. In particular the combination of a passive cooling element and an active cooling element enables a particularly efficient heat dissipation.

BRIEF DESCRIPTION OF THE DRAWINGS

Further characteristics, advantages and details of the invention can be derived from the following description of exemplary embodiments by means of the drawing.

It is shown.

DETAILED DESCRIPTION OF THE DRAWINGS AND THE PRESENTLY PREFERRED EMBODIMENTS

Figure 1:
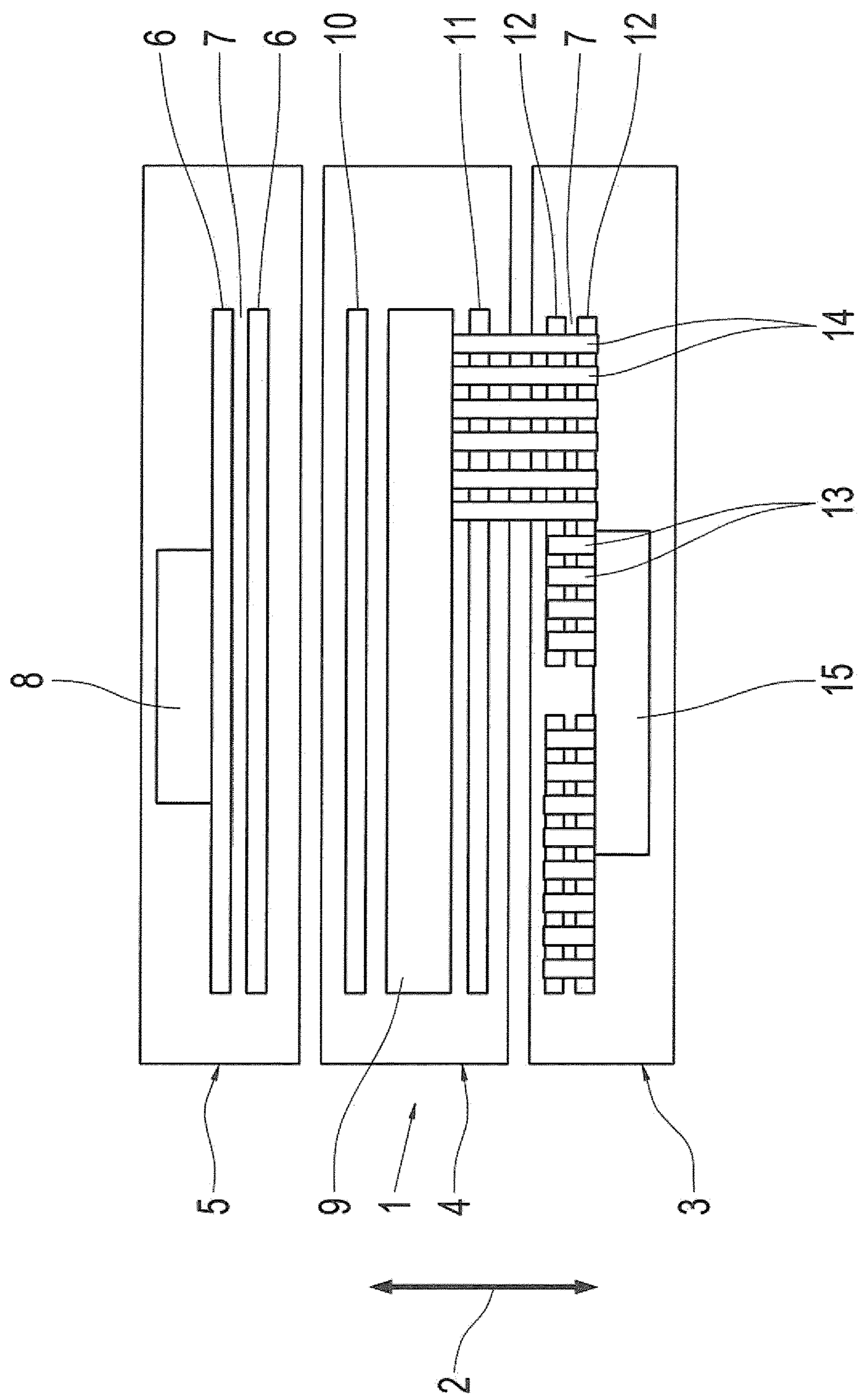
FIG. 1—a schematic cross-sectional depiction of a multifunctional high current circuit board according to the invention, FIG. 2—in accordance with FIG. 1, an enlarged section of a detail of a multifunctional high current circuit board according to a further embodiment and FIG. 3—a schematic depiction of the heat flux for the high current circuit board according to FIG. 2.
Figure 2:
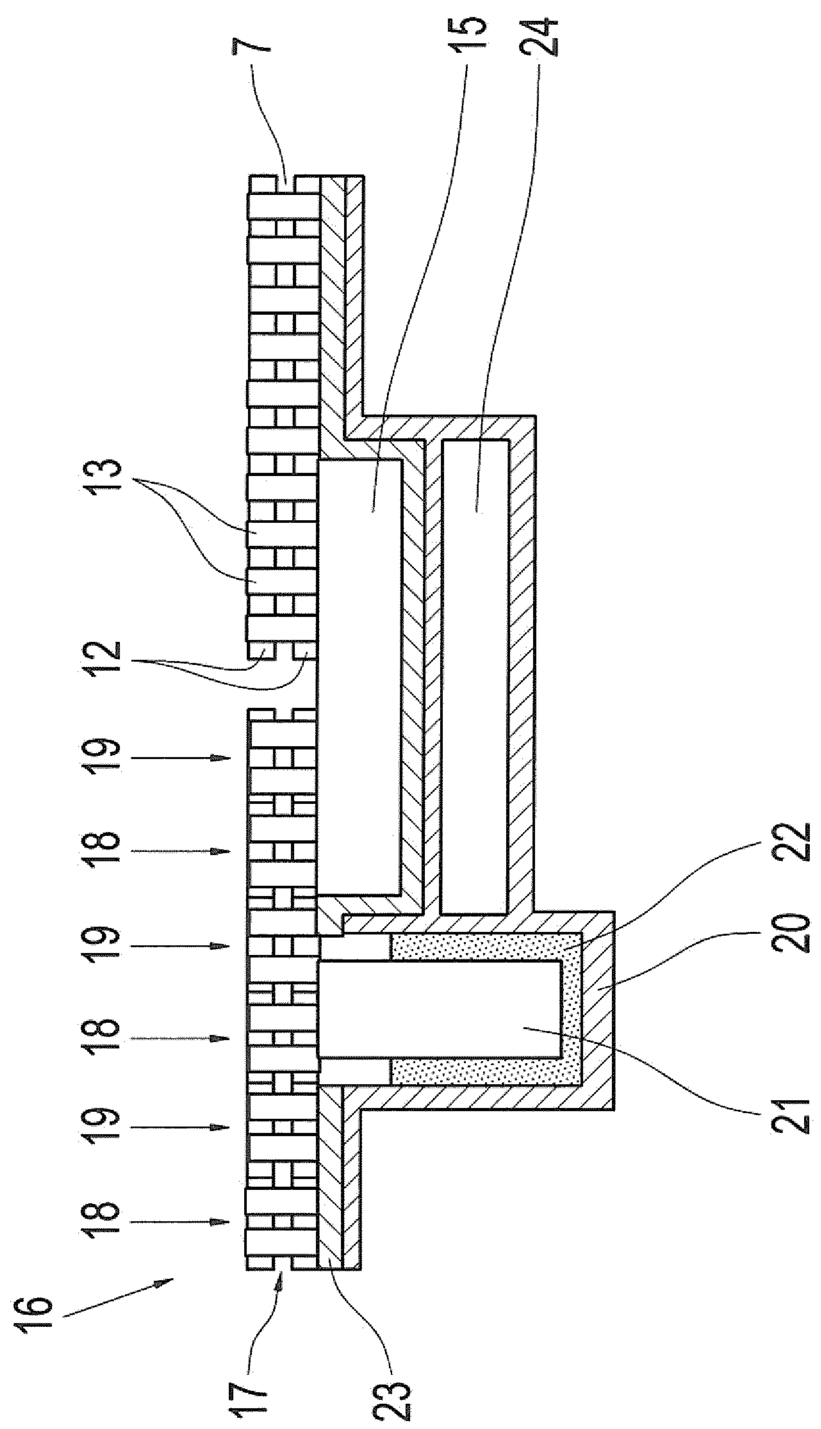
Figure 3:
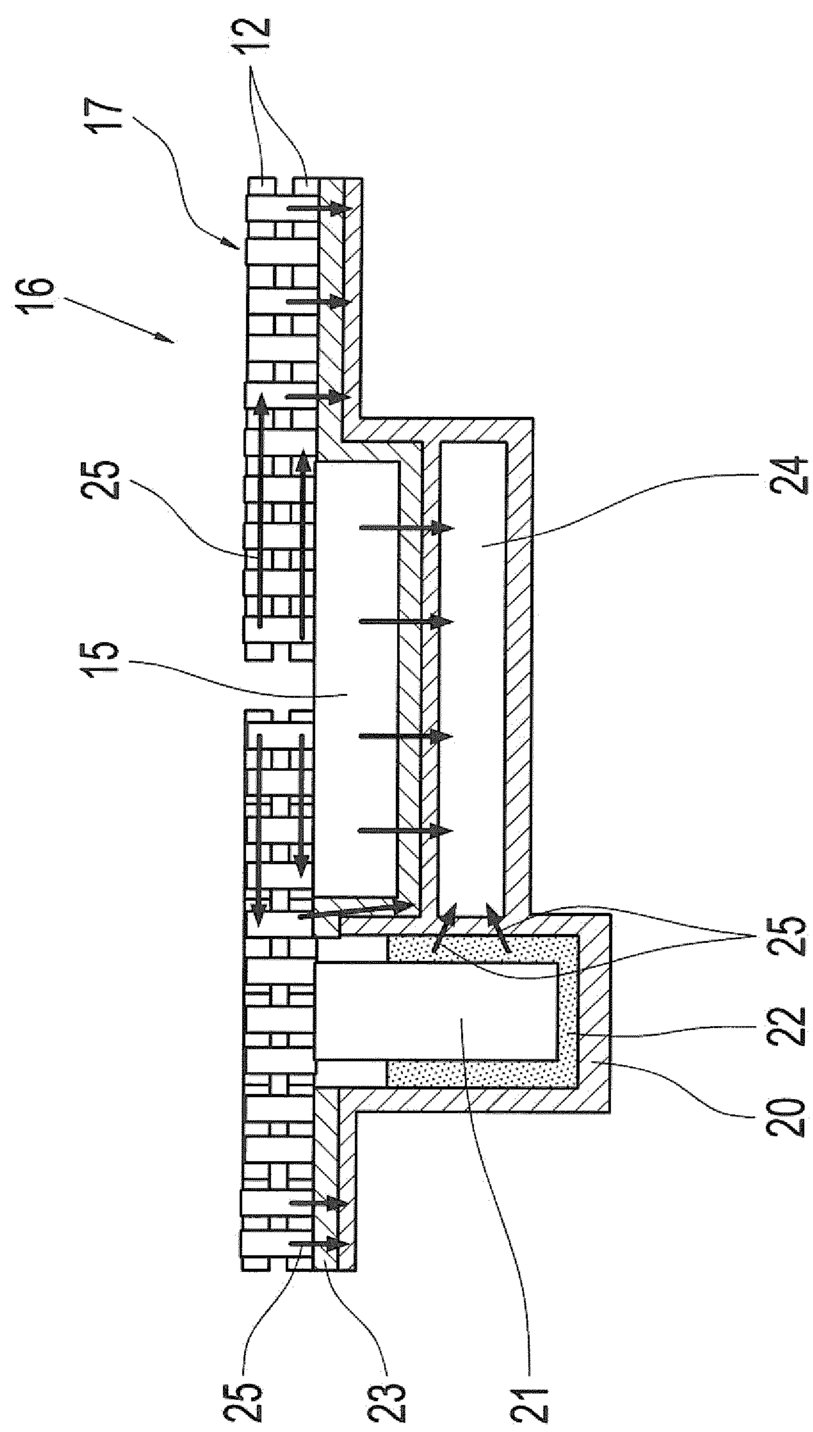

Components that are corresponding to each other in FIGS. 1 to 3 are given the same reference signs. Individual features in the embodiments that are explained in more detail in the following can also present an invention as such or be part of a subject-matter of the invention.

A multifunctional high current circuit board 1, as it is depicted in FIG. 1, is mainly a planar component. Planar means, that a longitudinal expansion and a width expansion is much larger respectively than an expansion of the thickness. The longitudinal and width expansion of the high current circuit board 1 is particularly larger than the expansion of the thickness at least by the factor 5, in particular at least by the factor 10, in particular at least by the factor 20 and in particular at least by the factor 50. The expansion of the thickness of the high current circuit board 1 is symbolized by the double arrow 2 in FIG. 1.

Along the thickness direction 2, the high current circuit board 1 comprises a switching layer 3, a current-conducting layer 4 and a control layer 5. The switching layer 3, the current-conducting layer 4 and the control layer 5 enable the multifunctionality of the high current circuit board. Each one of the layers 3, 4, 5 particularly enable at least one basic function of the high current circuit board 1, namely switching, conducting or controlling of the electrical current.

The control layer 5 comprises two control sub-layers 6. An insulating layer 7 is arranged between the control sub-layers 6. The insolating layer 7 prevents the direct flow of electrical current between the adjacent control sub-layers 6. The insulating layer 7 is particularly designed as a plastic material structure between the two control sub-layers 6. In the expansion of the thickness 2, the control sub-layers 6 are electrically separated from each other by means of the insulating layer 7.

At least one contacting element 8 is connected to the control sub-layer 6 that is facing away from the current-conducting layer 4. The control sub-layers 6 as such are known from the prior art. As an example, the control sub-layers 6 are interconnected by means of not depicted, micro through-hole platings that are filled with copper. The contacting element 8 is particularly arranged at an open surface of the high current circuit board 1. The contacting element 8 can easily be connected to in a direct and thus uncomplicated manner at the outer control sub-layer 6 of the control layer 5. The contacting of the high current circuit board 1 is simplified.

The current-conducting layer 4 features a high current-carrying structure 9. The high current-carrying structure 9 particularly comprises several, not individually depicted current-conducting layers. It is essential that are least two current-conducting layers are provided. It is advantageous if an evenly numbered amount of current-conducting layers are provided. The current-conducting layers have the function to supply and dissipate the electrical current from and to a power source. The current-conducting layers are particularly made as copper layers and especially as thick film copper layers. The current-conducting layer 4 is also referred to as thick film copper layer or thick film copper section. An insulating layer 7 can be arranged between two adjacent current-conducting layers. The high current-carrying structure 9 is electromagnetically shielded against the control layer 5 by means of a first shielding layer 10. The high current-carrying structure 9 is electromagnetically shielded against the switching layer 3 by means of a second shielding layer 11.

Switching layer 3 comprises two switching sub-layers 12. The switching sub-layers 12 are electrically separated from each other by means of an insulating layer 7. The switching sub-layers 12 are interconnected by means of several micro through-hole platings 13. The micro through-hole platings 13 are filled with copper. The switching sub-layers 12 that are interconnected by means of the micro through-hole platings 13 form a heat dissipation layer with an increased copper cross-section. The heat dissipation within the interconnected switching sub-layers 12 is improved. The switching sub-layers 12 are directly connected to the high current-carrying structure 9 of the current-conducting layer 4 by means of several feed throughs 14. A heat source in form of a power switch 15 is connected to the interconnected switching sub-layers 12. The power switch 15 is designed as a High-Side-(HS-)Switch. Alternatively, the power switch 15 can be designed as a Low-Side-(HS-)Switch. The power switch 15 connects the high current-carrying potentials of the switching sub-layers 12 in the switching layer 4 to a not depicted high current battery, in particular to DC+, by means of the contacting.

Since high current-carrying potentials can be applied to the two adjacent switching sub-layers 12 and since the switching sub-layers 12 are interconnected by means of micro through-hole platings 13, an enlarged copper cross-section is provided for heat dissipation. The heat dissipation is improved.

In the following, another embodiment of a high current circuit board 16 is explained. The switching layer 17 of the high current circuit board 16 is depicted in FIG. 2. Due to representational reasons, the remaining structure, in particular the current-conducting layer 4 and the control layer 5, is not depicted. The current-conducting layer 4 and the control layer 5 are arranged in accordance with the first embodiment. In contrast to the first embodiment, the connections to the high current battery are arranged in an alternating manner within the switching layer 17. The connections to the high current battery DC+ 18 and DC− 19 are depicted in a symbolic manner in FIG. 2.

A further difference to the first embodiment is a passive cooling element 20, which is arranged as a heat dissipation layer. The heat dissipation layer 20 is connected to the high current circuit board 16 by means of a heat conducting medium and facilitates heat dissipation.

In addition to the power switch 15, an electrolyte capacitor 21 is provided as additional heat source for the high current circuit board 16. The electrolyte capacitor 21 is directly connected to the connectors 18, 19. The electrolyte capacitor 21 is attached to the passive cooling element 20 via a sealing compound 22. The sealing compound 22 functions as a thermal connecting element. A further thermal connecting element is a heat-conducting medium 23, which is particularly arranged between the high current battery connectors 18, 19 and the passive cooling element 20, between the switching sub-layers 12 and the passive cooling element 20 as well as between the power switch 15 and the passive cooling element 20. The sealing compound 22 and the heat-conducting medium 23 are thermal connecting elements.

An active cooling element 24 is arranged adjacent to the power switch 15 and/or to the electrolyte capacitor 21. The active cooling element 24 is designed e.g. as a cooling water pump. The active cooling element 24 is attached to the electrolyte capacitor 21 and/or to the power switch 15 via the passive cooling element 20.

The power switch 15 and the electrolyte capacitor 21 are heat sources.

In the following, a heat flux that is occurring during the operation of the high current circuit board 16 is explained by means of FIG. 3. During the operation of the high current circuit board 16, the heat sources, i.e. the electrolyte capacitor 21 and the power switch 15, produce heat. A dissipation of the heat is carried out along the heat flux direction 25 that is depicted in a symbolic manner in FIG. 3. A substantial heat flux direction 25 is from the heat sources 15, 21 towards the active cooling element 24. The heat sources 15, 21 are particularly cooled on two sides. This ensures that impermissibly high temperatures occur at the power switch 15 and/or at the electrolyte capacitor 21. The two-sided cooling is made possible in that the heat can be dissipated in a horizontal direction through the optimized copper structure within the switching layer 17 along the switching sub-layers 12. A second additional heat flux is ensured via the passive cooling element 20 and the active cooling element 24 and in particular via the heat-conducting medium 23 or the sealing compound 22, which is arranged in between.

The high current circuit board presents an optimized heat-conducting system. On the one hand, the heat dissipation structure is created by means of the integrated configuration of the high current-carrying potentials within the switching layer 17 and by means of the optimized attachment of cooling elements 20, 24. The high current circuit board can be used in high temperature applications and/or for applications of a circuit board with limited active cooling.

LIST OF REFERENCE SIGNS

1 High current circuit board
2 Expansion of the thickness
3 Switching layer
4 Current-conducting layer
5 Control layer
6 Control sub-layer
7 Insolating layer
8 Connecting element
9 High current-carrying structure
10 First shielding layer
11 Second shielding layer
12 Switching sub-layers
13 Micro through-hole platings
14 Feed through
15 Power switch
16 High current circuit board
17 Switching layer
18 DC+
19 DC−
20 Passive cooling element
21 Electrolyte capacitor
22 Sealing compound
23 Heat-conducting medium
24 Active cooling element
25 Heat flux

The invention claimed is:

1. A multifunctional high current circuit board comprising: a. a high-current-conducting layer that includes a high current-carrying structure: and b. a switching layer that includes: two switching sub-layers electrically and thermally connected to the high current-carrying structure, and at least two heat sources arranged adjacent to one another, disposed below the two switching sub-layers, wherein the two switching sub-layers are configured to carry high current potentials; wherein the two switching sub-layers are interconnected by at least one micro through-hole plating; wherein high current-carrying potentials are conducted into the switching layer; and a monolithic passive cooling element configured to overlay the at least two heat sources, wherein the passive cooling element defines first and second partially enclosed spaces for receiving a first and a second of the at least two heat sources, respectively, wherein an interior of the first enclosed space is configured to compliment an outside surface of the first heat source, and an interior of the second enclosed space is configured to complement an outside surface of the second heat source to thereby efficiently draw heat generated by the respective heat sources away from the heat sources.

2. The multifunctional high current circuit board of claim 1, wherein the at least one heat source comprises an electrolyte capacitor and/or a power switch.

3. The multifunctional high current circuit board of claim 1, wherein the passive cooling element is at least in some sections attached to the high current circuit board by a heat-conducting medium.

4. The multifunctional high current circuit board of claim 1, wherein the passive cooling element is directly connected to one or both of: at least one of the at least two heat sources and the two switching sub-layers via a thermal connecting element.

5. The multifunctional high current circuit board of claim 4, wherein the thermal connecting element is a sealing compound and/or a heat-conducting medium.

6. The multifunctional high current circuit board of claim 1 further comprising an active cooling element.

7. The multifunctional high current circuit board of claim 6, wherein the active cooling element is designed as a cooling fan or as cooling water pump.

8. The multifunctional high current circuit board of claim 6, wherein the active cooling element is connected to the at least one heat source via a thermal connecting element and/or via a passive cooling element.

9. The multifunctional high current circuit board of claim 1, wherein the passing cooling element is designed as a heat dissipation layer.

10. The multifunctional high current circuit board of claim 1, wherein the passive cooling element is at least in some sections attached to the high current circuit board by a heat-conducting medium.

11. The multifunctional high current circuit board of claim 3, wherein the passive cooling element is directly connected to the one or both of: at least one of the at least two heat source and the two switching sub-layers via a thermal connecting element.

12. The multifunctional high current circuit board of claim 11, wherein the thermal connecting element is a sealing compound and/or a heat-conducting medium.

13. The multifunctional high current circuit board of claim 6, wherein the active cooling element is arranged adjacent to the at least one heat source.

14. The multifunctional high current circuit board of claim 13, wherein the active cooling element is designed as a cooling fan or as cooling water pump.

15. The multifunctional high current circuit board of claim 7, wherein the active cooling element is connected to the at least one heat source via a thermal connecting element and/or via a passive cooling element.

* * * * *